(12) United States Patent
Goldovsky

(10) Patent No.: US 6,640,324 B1
(45) Date of Patent: Oct. 28, 2003

(54) BOUNDARY SCAN CHAIN ROUTING

(75) Inventor: Alexander Goldovsky, Philadelphia, PA (US)

(73) Assignee: Agere Systems Inc., Allentown, PA (US)

( * ) Notice: Subject to any disclaimer, the term of this patent is extended or adjusted under 35 U.S.C. 154(b) by 469 days.

(21) Appl. No.: 09/633,795

(22) Filed: Aug. 7, 2000

(51) Int. Cl.⁷ .............................................. G01R 31/28
(52) U.S. Cl. ...................................... 714/729; 714/726
(58) Field of Search ................................ 714/726, 731, 714/700, 727, 729; 345/764

(56) References Cited

U.S. PATENT DOCUMENTS

| | | | |
|---|---|---|---|
| 4,074,851 A | * 2/1978 | Eichelberger et al. | 714/726 |
| 5,355,369 A | 10/1994 | Greenberger | 371/223 |
| 5,617,426 A | * 4/1997 | Koenemann et al. | 714/726 |
| 5,701,335 A | * 12/1997 | Neudeck | 377/69 |
| 5,898,776 A | * 4/1999 | Apland et al. | 326/8 |
| 5,991,908 A | * 11/1999 | Baxter et al. | 714/727 |

* cited by examiner

*Primary Examiner*—David Ton
*Assistant Examiner*—Mujtaba Chaudry
(74) *Attorney, Agent, or Firm*—David L. Smith

(57) ABSTRACT

An integrated circuit includes a semiconductor die having a plurality of input/output pads and a plurality of boundary scan cells. Each of the boundary scan cells includes a TDI input and a TDO output. A first boundary scan cell is the first boundary scan cell of the plurality of boundary scan cells to receive data. A last boundary scan cell is the last boundary scan cell of the plurality of boundary scan cells to receive data. An endless control conductor forms a loop proximate the plurality of boundary scan cells. The endless control conductor is coupled to each of the plurality of boundary scan cells to provide a test clock signal thereto. At least one other control conductor extends around the semiconductor die proximate the plurality of boundary scan cells. The at least one other control conductor is discontinuous between the first and last boundary scan cells.

21 Claims, 3 Drawing Sheets

BOUNDARY SCAN CHAIN ROUTING

TECHNICAL FIELD

This invention relates to integrated circuits, and more particularly to the routing of boundary scan control conductors to control boundary scan cells associated with the integrated circuit input/output pads.

BACKGROUND OF THE INVENTION

The use of boundary scan chains to input data into integrated circuits, test integrated circuits and test systems of integrated circuits has become ubiquitous. EEE standard 1149.1, and revisions thereto, each of which is hereby incorporated by reference, often referred to as JTAG, defines the logic for implementing a boundary scan chain. U.S. Pat. No. 5,355,369 discloses a high speed integrated circuit that provides for boundary scan testing, the disclosure of which is hereby incorporated by reference. A boundary scan chain is comprised of cells of logic at each input/output path. The input/output paths are typically located around the periphery of an integrated circuit die. The logic cells, also known as boundary scan cells, are controlled in accordance with the above-mentioned standard by control signals. The control signals are typically provided to each boundary scan cell by a "ring" bus proximate the boundary scan cells, with each ring bus conductor being endless, that is forming a loop, and driven at a single point. Data is transferred sequentially from one boundary scan cell to an adjacent boundary scan cell. Thus data is shifted from any boundary scan cell to an adjacent boundary scan cell in the same manner data is shifted from a register in a shift register to the next register in the shift register.

A problem that arises with the ring implementation of the control signal conductors is the potential for a race condition. The race condition occurs when transferring data between two adjacent latches. One of the adjacent latches is the output latch of a boundary scan cell from which data is being transferred and the other of the adjacent latches is the input latch of the adjacent boundary scan cell into which data is being shifted. A race condition exists if the skew introduced in the clock control signal between the two adjacent latches is greater than the propagation delay to transfer data from one of the two adjacent latches to the other.

One technique to overcome the potential race condition is to break the ring bus conductor to which the clock signal is applied. The ring bus conductor is broken between the first boundary scan cell and the last boundary scan cell in the boundary scan chain. The clock signal drives an end of the broken clock ring bus conductor such that the clock signal propagates around the broken ring in the opposite direction that data is shifted through adjacent boundary scan cells. In this manner, data is shifted around the sequence of boundary scan cells in one direction, for example counter clockwise, while the clock signal propagates around the broken clock ring bus conductor in the opposite direction, for example clockwise, or vice versa.

While this technique resolves the race condition described above, another potential race condition is introduced by breaking the clock ring bus conductor and driving an end of the broken clock ring bus conductor. The potential race condition introduced occurs at the first boundary scan cell to receive data. The first boundary scan cell receives the clock signal with the greatest skew since the clock signal travels the greatest distance to arrive at the first boundary scan cell.

When the active low shift signal goes low, the data being shifted into the first boundary scan cell passes through the first, master, latch and is latched in a second, slave, latch when the shift signal arrives at the first boundary scan cell before the clock signal arrives (a late clock condition) at the first boundary scan cell.

What is needed is a technique to overcome the potential race condition, introduced in the ring bus configuration, due to clock skew being greater than the propagation delay to transfer data from one of two adjacent latches to the other, without introducing other potential race conditions.

SUMMARY OF THE INVENTION

In accordance with the invention, an integrated circuit includes a semiconductor die having a plurality of input/output pads. A plurality of boundary scan cells, one corresponding to each input/output pad, implements boundary scan functions associated with respective input/output pads. Each of the boundary scan cells includes a TDI input and a TDO output. The boundary scan cells are structured as a shift register to shift data from one boundary scan cell in a direction unilaterally to an adjacent boundary scan cell. A first boundary scan cell is the first boundary scan cell of the plurality of boundary scan cells to receive data. A last boundary scan cell is the last boundary scan cell of the plurality of boundary scan cells to receive data. An endless control conductor forms a loop proximate the plurality of boundary scan cells. The endless control conductor is coupled to each of the plurality of boundary scan cells to provide a test clock signal thereto. At least one other control conductor extends around the semiconductor die proximate the plurality of boundary scan cells. The at least one other control conductor is coupled to each of the plurality of boundary scan cells and is discontinuous between the first and last boundary scan cells. The invention may also be implemented at a system level.

DETAILED DESCRIPTION

Figure 1:
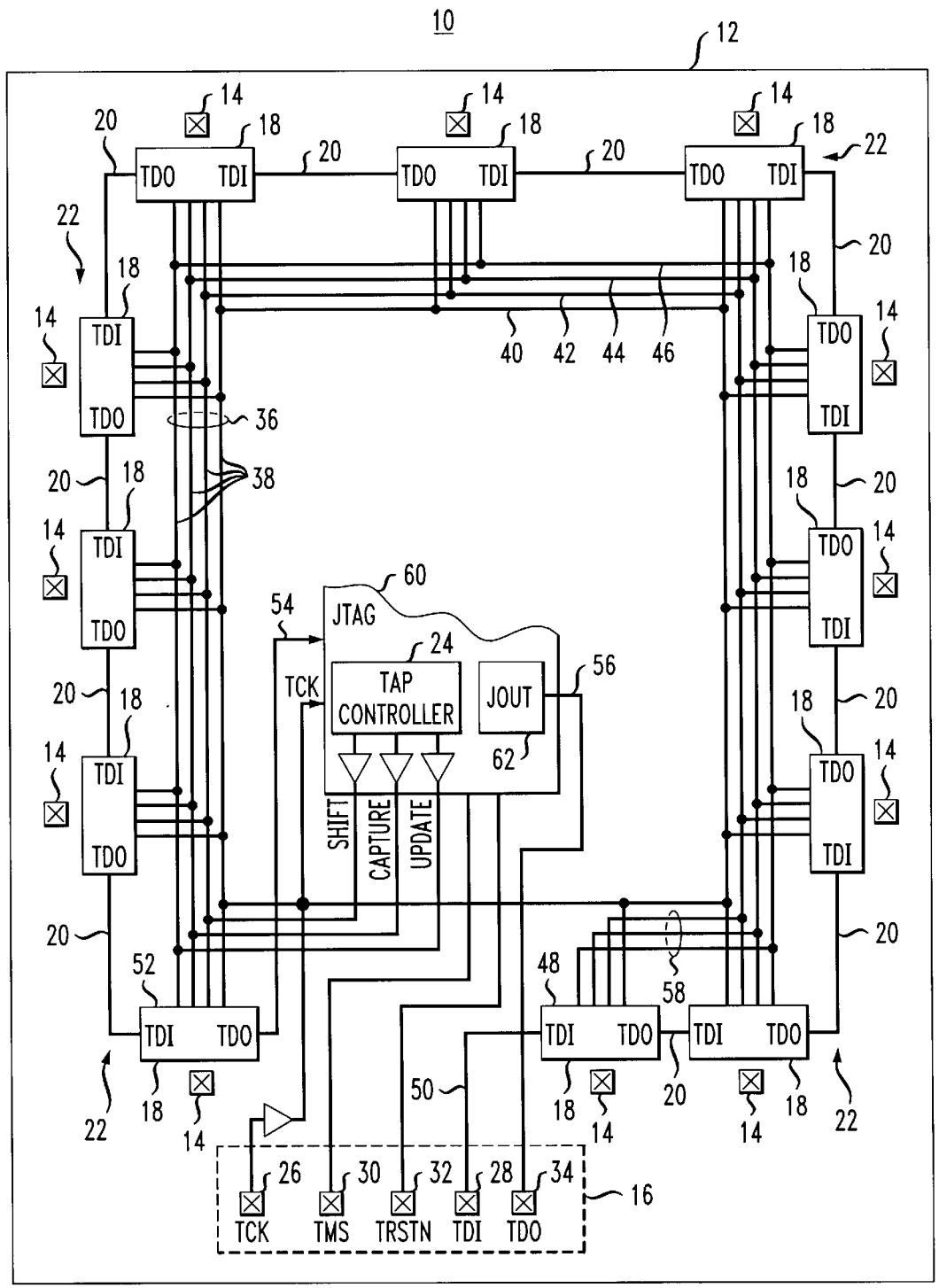
FIG. 1 is an enlarged top view of a portion of an integrated circuit including control lines for conducting control signals to boundary scan cells in accordance with the present invention.

An enlarged portion of an integrated circuit 10 semiconductor die 12 illustrating routing of boundary scan control conductors in accordance with the invention is illustrated in FIG. 1. Semiconductor die 12 is not drawn to scale. Semiconductor die 12 includes a plurality of bond pads 14 to which bond wires (not shown) are bonded to connect to leads (not shown) or metalizations (not shown) for further interconnection to an array of solder bumps or posts, as is known in the art. Bond pads 14 are typically located proximate the periphery of semiconductor die 12. Bond pads 14 provide an interface, to circuits (not shown) on semiconductor die, each of which can provide an input, an output, or both an input and an output, herein referred to as an input/output or input/output port.

Associated with each bond pad 14, except those bond pads representing the JTAG interface 16 and others, is a scan cell or boundary scan cell 18 for testing or programming of the integrated circuit, or testing or programming of a system of integrated circuits. Boundary scan cells are comprised of logic circuits and isolation circuitry. Each boundary scan cell 18 can read the logic state of its associated bond pad, drive a logic state onto its associated bond pad, or can be isolated from its associated bond pad 14. Boundary scan cells 18 are typically located proximate the associated bond pad 14, and therefore are typically located around the periphery of semiconductor die 12.

Boundary scan cells 18 are designed to shift data, in the form of one bit, from one boundary scan cell to an adjacent boundary scan cell over lines 20 in a unilateral direction, much like shifting bits into or through registers of a serial shift register In this manner, boundary scan cells 18 form a boundary scan chain 22. As with any serial shift register, until all boundary scan cells have been loaded with meaningful data, the output from the last boundary scan cell in chain 22 is not meaningful.

Boundary scan cells 18 are controlled by the JTAG test access port (TAP) controller 24. Controller 24 is coupled to each of the bond pads of JTAG interface 16. TCK input pad 26 provides a test clock input. TDI input pad 28 provides test data to the first boundary scan cell in chain 22 to receive data. TRSTN input pad 32 provides a negative triggered reset function. TMS input pad 30 is a test mode select that is provided to controller 24 to select the mode of operation of boundary scan chain 22. When the boundary scan mode is selected, the TDO output pad 34 receives the test data sequenced through the boundary scan cells from the JOUT block 62 over conductor 56.

A control bus 36 comprised of conductors 38 provide control signals from JTAG interface 16 or controller 24 to each of the boundary scan cells 18. Control bus 36 is typically located proximate boundary scan cells 18 and therefore around the periphery of semiconductor die 12. Conductors 38 in bus 36 may or may not be continuous or endless, forming a loop proximate the boundary scan cells 18. When fabricating an integrated circuit having multiple layers of metal, bus 36 is typically fabricated in the top layer of metal. However, the invention is not limited thereto. With appropriate interconnects as is known in the art, bus 36 could be fabricated in more than one layer of metal.

Four conductors 38 of bus 36 will be discussed although bus 36 may have more than four conductors. They are clock conductor 40, shift conductor 42, capture conductor 44, and update conductor 46. A test clock signal is applied to JTAG interface bond pad 26. The test clock signal, TCK, is applied to both clock conductor 40 and JTAG block 60. JTAG block 60 develops a shift signal which is applied to shift conductor 42, a capture signal which is applied to capture conductor 44, and an update signal which is applied to update conductor 46. When in the scan mode of operation, the shift signal causes data to shift from one boundary scan cell to the next boundary scan cell in chain 22. A new data bit is shifted into the first boundary scan cell, first cell 48, in the chain over line 50 from bond pad 28. In addition, a data bit is shifted out of the last boundary scan cell, last cell 52, in the chain over line 54 to JOUT block 62 thence over line 56 to bond pad 34 of JTAG interface 16.

In accordance with the invention, clock conductor 40 in control bus 36 is endless, or continuous, forming a loop around the boundary scan cells 18 to which it is connected. The shift conductor 42, capture conductor 44 and update conductor 46 are interrupted or discontinuous, and are collectively known as interrupted conductors 58. Interrupted conductors 58 are driven by controller 24 and the first tap from each of interrupted conductors 58 provides shift, capture and update signals to last cell 52 in chain 22. The second tap from each of conductors 58 provides shift, capture and update signals to the next-to-the-last cell, the boundary scan cell from which last cell 52 receives data. The shift, capture and update signals propagate along conductors 42, 44, and 46 respectively to each of the boundary scan cells 18 in chain 22, with first cell 48 being the last boundary scan cell to receive the signals. In this manner, the shift, capture, and update signals propagate around the boundary scan cells 18 of chain 22 in a direction opposite to the unilateral direction data is shifted from one boundary scan cell 18 to an adjacent boundary scan cell 18 in chain 22. The shift, capture and update signals propagate around boundary scan cells 18 of chain 22 in a direction opposite to the unilateral direction data is shifted from one boundary scan cell to an adjacent boundary scan cell due to two factors. Firstly, respective conductors 42, 44, and 46 are interrupted between the tap points where conductors 42, 44, and 46 are connected to last cell 52 and the respective tap points where conductors 42, 44, and 46 are connected to first cell 48. Secondly, the respective signals are impressed on conductors 42, 44, and 46 at the end of the respective conductors proximate the tap point for last cell 52, such that the signals propagate along the conductors from, and are presented to boundary scan cells 18 in chain 22 in a sequence to, last cell 52 to first cell 48.

Figure 2:
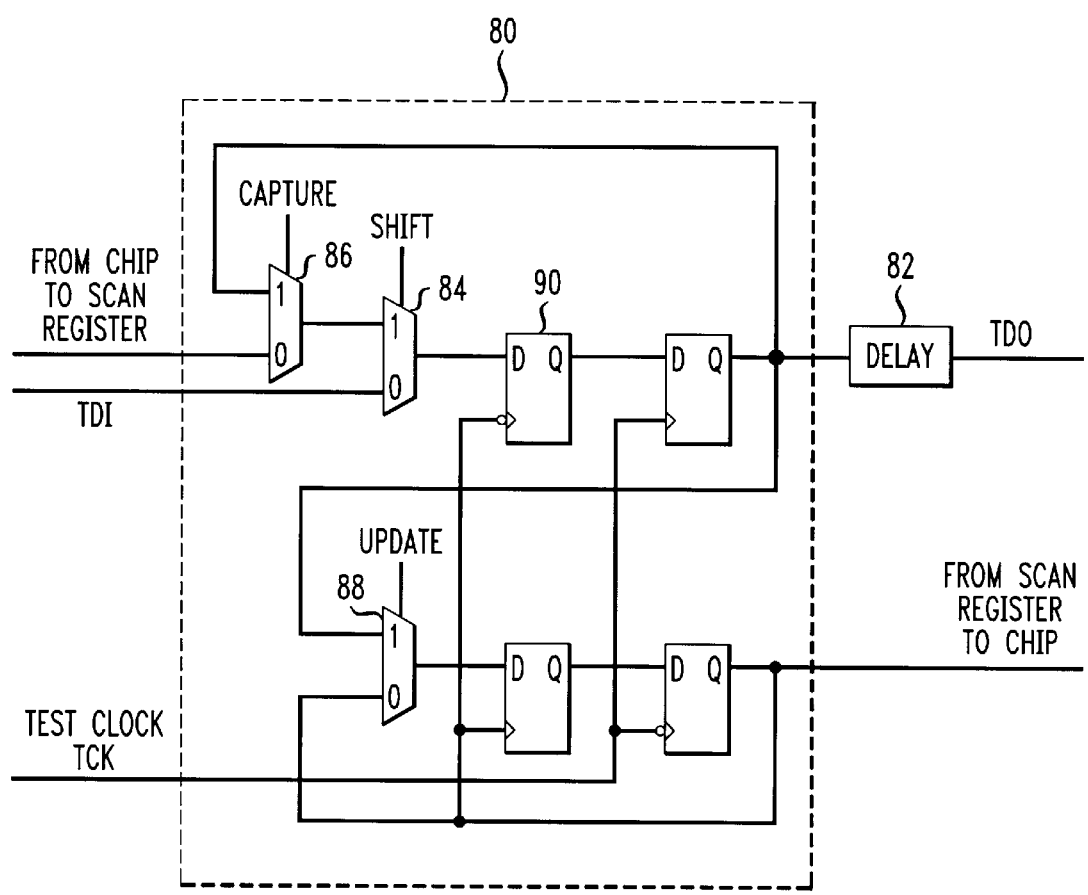
FIG. 2 is schematic diagram of a portion of a typical boundary scan cell including a delay in accordance with the present invention.

FIG. 2 is a schematic diagram of a scan register 80 portion of a typical boundary scan cell 18, including an additional delay line 82. Shift, capture and update signals provide control inputs respectively to multiplexers 84, 86, and 88. With test data presented at the TDI input of multiplexer 84, the test data is passed to the output of master latch 90 when the shift signal is low and the test clock signal is low, thence to the output of a slave latch when the test clock signal transitions high. Delay 82 introduces a predetermined delay into presentation of the data at the output of the slave latch as the test data output, TDO, of the typical boundary scan cell. In a preferred embodiment, the duration of the delay is approximately at least 80% of half of the period of the test clock, TCK, signal. The delay may be implemented in any known manner.

The output data from TDO bond pad 34 is provided to a scan module (not shown). The scan module operates on the data received to verify that the output data is as expected, and therefore the conclusion may be drawn that the integrated circuit or system that generated the output data is operating correctly.

Routing the clock, shift, and capture control conductors, and hence the signals imposed thereon, in the manner described above may, in some applications, be sufficient to assure the test clock signal arrives at the first cell 48 before the shift, capture, and update signals arrive at the first cell 48 in a chain 22. The shift, capture, and update signals incur a longer propagation delay by the time they reach first cell 48 than the test clock signal incurs by the time it reaches first cell 48 due to the relative lengths of the signal paths the signals take over conductors 38. Introducing a predetermined delay to defer the data output from each boundary scan cell obviates the potential race at first cell 48 and assures that the test clock signal will arrive at first cell 48 before the shift, capture, and update signals arrive.

Figure 3:
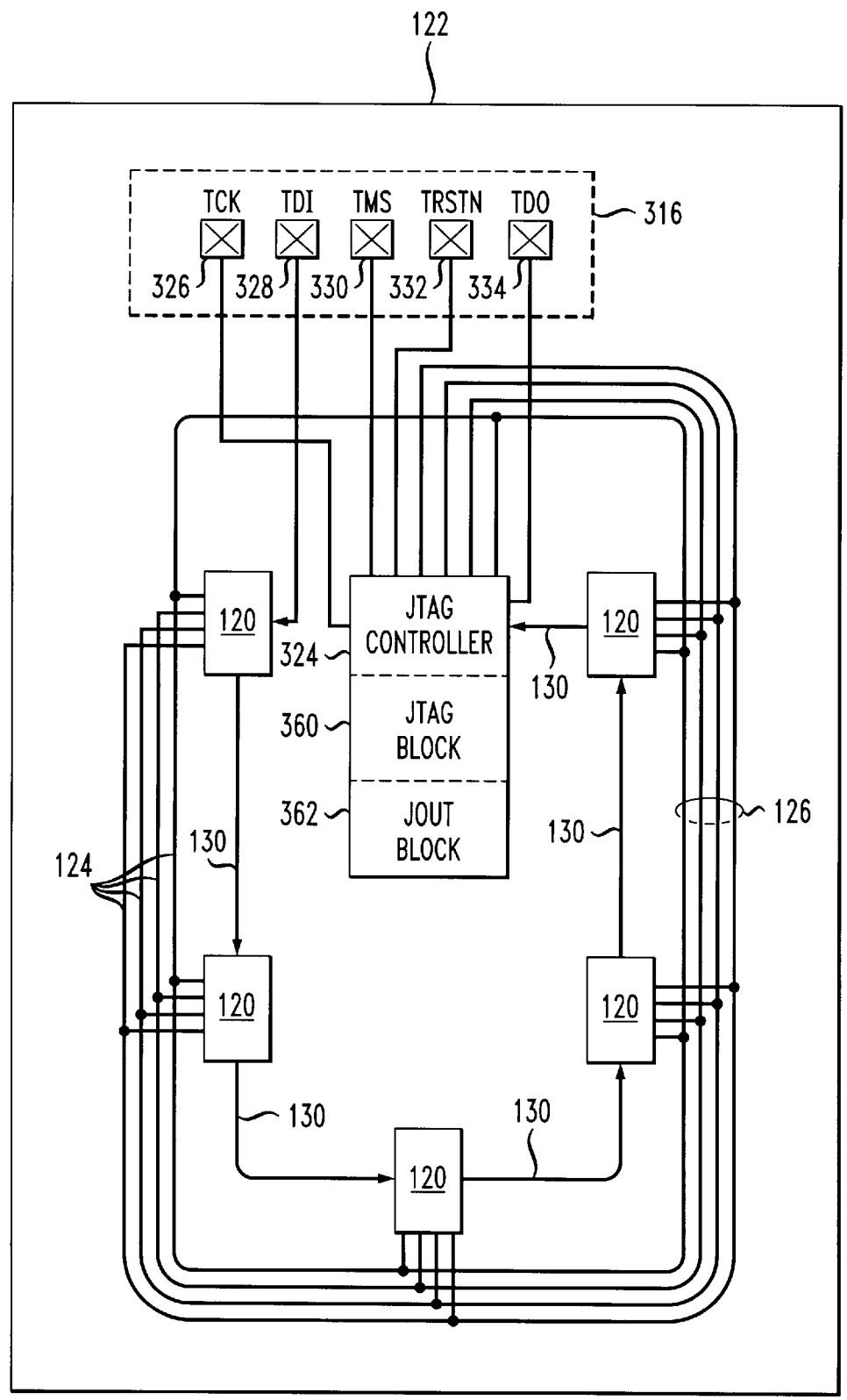
FIG. 3 is a schematic diagram of a portion of a system level application illustrating use of control lines for a scan chain among a plurality of integrated circuits mounted on a circuit board, in accordance with the invention.

FIG. 3 illustrates application of the invention to a system. Integrated circuits 120 are mounted on circuit board 122.

Traces 124 form a bus 126 to interconnect integrated circuits 120 with JTAG control signals and to transfer data. A JTAG interface 316 includes TCK, TDI, TMS, TRSTN and TDO input pads denoted 326, 328, 330, 332 and 334, respectively. Bus 126 interconnects integrated circuits 120 in a chain. Data can be transferred on one trace 124 serially from one integrated circuit to the next integrated circuit in the chain. Each integrated circuit 120 has a boundary scan chain 22 as described above. The JTAG control functions for the system may be performed by the JTAG controller and JOUT block of one of the integrated circuits, or there may be, as illustrated in FIG. 3, a separate JTAG controller 324, JTAG block 360 and JOUT block 362 at the system level. From the foregoing description, operation at the system level will be apparent to one skilled in the art.

What is claimed is:

1. An integrated circuit, comprising:
   a semiconductor die having a plurality of input/output pads;
   a plurality of boundary scan cells, each boundary scan cell capable of implementing boundary scan functions associated with one of the plurality of input/output pads, each boundary scan cell having a TDI input and a TDO output, the plurality of boundary scan cells structured as a shift register to shift data from one boundary scan cell in a direction unilaterally to an adjacent boundary scan cell, one of the plurality of boundary scan cells being a first boundary scan cell defined as the first of the plurality of boundary scan cells to receive data, one of the plurality of boundary scan cells being a last boundary scan cell defined as the last of the plurality of boundary scan cells to receive data;
   an endless control conductor forming a loop proximate the plurality of boundary scan cells, the endless control conductor coupled to each of the plurality of boundary scan cells for conducting a test clock signal to each of the plurality of boundary scan cells; and
   at least one other control conductor extending around the semiconductor die proximate the plurality of boundary scan cells, the at least one other control conductor coupled to each of the plurality of boundary scan cells, the at least one other control conductor discontinuous between the first and last boundary scan cells.

2. An integrated circuit as recited in claim 1, wherein the control signal applied to the at least one other control conductor is selected from the group consisting of a shift signal, a capture signal, and an update signal.

3. An integrated circuit as recited in claim 1, wherein the control signal coupled to the at least one other control conductor is coupled where the at least one control conductor is discontinuous such that the control signal driven onto the at least one other control conductor propagates to each of the plurality of boundary scan cells along the at least one other control conductor in a direction opposite to the unilateral direction data is shifted from one boundary scan cell to an adjacent boundary scan cell.

4. An integrated circuit as recited in claim 1, further comprising:
   each boundary scan cell including a delay in series with the TDO output to introduce a predetermined delay into presentation of an output from the respective boundary scan cell.

5. An integrated circuit as recited in claim 4, the predetermined delay has a duration that is at least 80% of half of the period of a clock signal imposed on a control conductor.

6. An integrated circuit as recited in claim 1, wherein the at least one other control conductor comprises at least three other control conductors, each of the at least three other control conductors coupled to each of the plurality of boundary scan cells, each of the at least three other control conductors discontinuous between the first and last boundary scan cells.

7. An integrated circuit as recited in claim 6, wherein control signals applied to the at least three other control conductors comprise a shift signal, a capture signal and an update signal.

8. A system, comprising:
   a substrate;
   a plurality of integrated circuits mounted on the substrate;
   a plurality of scan cells, each scan cell capable of implementing scan functions associated with one of the plurality of integrated circuits, each scan cell having a TDI input and a TDO output, the plurality of scan cells structured as a shift register to shift data from one integrated circuit in a direction unilaterally to an adjacent integrated circuit, one of the plurality of integrated circuits being a first integrated circuit defined as the first of the plurality of integrated circuits to receive data, one of the plurality of integrated circuits being a last integrated circuits defined as the last of the plurality of integrated circuits to receive data;
   an endless control conductor forming a loop proximate the plurality of integrated circuits, the endless control conductor coupled to each of the plurality of integrated circuits for conducting a test clock signal to each of the plurality of integrated circuits; and
   at least one other control conductor extending around the substrate proximate the plurality of integrated circuits, the at least one other control conductor coupled to each of the plurality of integrated circuits, the at least one other control conductor discontinuous between the first and last integrated circuits.

9. A system as recited in claim 8, wherein the control signal applied to the at least one other control conductor is selected from the group consisting of a shift signal, a capture signal, and an update signal.

10. A system as recited in claim 8, wherein the control signal coupled to the at least one other control conductor is coupled where the at least one control conductor is discontinuous such that the control signal driven onto the at least one other control conductor propagates to each of the plurality of integrated circuits along the at least one other control conductor in a direction opposite to the unilateral direction data is shifted from one integrated circuit to an adjacent integrated circuit.

11. A system as recited in claim 8, further comprising:
    each integrated circuit including a buffer in series with each TDO output to introduce a predetermined delay into presentation of an output from the respective integrated circuit.

12. A system as recited in claim 11, wherein the predetermined delay has a duration that is at least 80% of half of the period of a clock signal imposed on a conductor.

13. A system as recited in claim 8, wherein the at least one other control conductor comprises at least three other control conductors, each of the at least three other control conductors coupled to each of the plurality of integrated circuits, each of the at least three other control conductors discontinuous between the first and last integrated circuits.

14. A system as recited in claim 13, wherein control signals applied to the at least three other control conductors comprise a shift signal, a capture signal and an update signal.

15. A method of controlling a scan system, comprising:

Implementing, in a plurality of scan cells, boundary scan functions associated with one of the plurality of input/output pads, each scan cell having a TDI input and a TDO output, the plurality of boundary scan cells structured as a shift register to shift data from one boundary scan cell in a direction unilaterally to an adjacent boundary scan cell, one of the plurality of boundary scan cells being a first boundary scan cell defined as the first of the plurality of scan cells to receive data, one of the plurality of scan cells being a last boundary scan cell defined as the last of the plurality of scan cells to receive data;

routing an endless control conductor forming a loop proximate the plurality of scan cells;

coupling the endless control conductor to each of the plurality of scan cells for conducting a test clock signal to each of the plurality of scan cells; and routing at least one other control conductor proximate the plurality of scan cells, the at least one other control conductor coupled to each of the plurality of scan cells, the at least one other control conductor discontinuous between the first and last scan cells.

16. A method as recited in claim 15, further comprising the step of applying a control signal selected from the group consisting of a shift signal, a capture signal, and an update signal to the at least one other control conductor.

17. A method as recited in claim 15, further comprising the step of coupling the control signal to the at least one other control conductor couples the control signal to the conductor where the at least one control conductor is discontinuous such that the control signal driven onto the at least one other control conductor propagates to each of the plurality of boundary scan cells along the at least one other control conductor in a direction opposite to the unilateral direction data is shifted from one boundary scan cell to an adjacent boundary scan cell.

18. A method as recited in claim 15, further comprising the step of:

introducing a delay into the TDO output to introduce a delay of predetermined duration into presentation of an output from the respective scan cell.

19. A method as recited in claim 18, wherein the step of introducing a delay, comprises introducing a delay having a duration that is at least 80% of half of a period of a clock signal driven onto one of the control conductors.

20. A method as recited in claim 15, wherein the at least one other control conductor comprises at least three other control conductors, each of the at least three other control conductors coupled to each of the plurality of boundary scan cells, each of the at least three other control conductors discontinuous between the first and last boundary scan cells.

21. A method as recited in claim 20, wherein applying control signals to the at least three other control conductors comprises applying a shift signal, a capture signal and an update signal.

* * * * *